(12) United States Patent
Swanson

(10) Patent No.: US 6,670,834 B1
(45) Date of Patent: Dec. 30, 2003

(54) DIGITAL LOCK DETECT FOR DITHERING PHASE LOCK LOOPS

(75) Inventor: Richard W. Swanson, Zimmnerman, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/241,911

(22) Filed: Sep. 12, 2002

(51) Int. Cl.[7] ................................................. H03L 7/06
(52) U.S. Cl. ........................................ 327/156; 327/159
(58) Field of Search ................................. 327/147–151, 327/156–160

(56) References Cited

U.S. PATENT DOCUMENTS

| | | | | |
|---|---|---|---|---|
| 5,126,690 A | * | 6/1992 | Bui et al. ................... | 331/1 A |
| 5,394,444 A | * | 2/1995 | Silvey et al. ................ | 375/374 |
| 5,969,576 A | * | 10/1999 | Trodden ..................... | 331/1 A |
| 6,177,842 B1 | * | 1/2001 | Ahn et al. .................. | 331/1 A |
| 6,466,058 B1 | * | 10/2002 | Goldman ..................... | 327/49 |
| 6,522,206 B1 | * | 2/2003 | Kornblum et al. .......... | 331/1 A |

* cited by examiner

*Primary Examiner*—Tuan T. Lam
(74) *Attorney, Agent, or Firm*—Christopher P. Maiorana, P.C.

(57) ABSTRACT

A first circuit and a second circuit. The first circuit may be configured to generate a first intermediate signal, a second intermediate signal, and a third intermediate signal in response to a first control signal, a second control signal, a third control signal, a reference signal and an output clock signal. The second circuit may be configured to generate an output signal in response to the first intermediate signal, the second intermediate signal, and the third intermediate signal. The output signal may indicate a lock condition between a feedback signal and the reference signal.

17 Claims, 11 Drawing Sheets

DIGITAL LOCK DETECT FOR DITHERING PHASE LOCK LOOPS

FIELD OF THE INVENTION

The present invention relates to integrated circuits generally and, more particularly, to a method and/or architecture for implementing a digital lock detect for dithering phase lock loops.

BACKGROUND OF THE INVENTION

Conventional Phase Lock Loops (PLLs) are a common implementation in many circuit designs. Phase lock loops operate as frequency scaling devices that typically generate an output signal that has a frequency that is a multiple of the frequency of an input signal.

Conventional systems implement a lock detect circuit to determine when the phase lock loop obtains a lock to either a logic high level or a logic low level. In conventional phase lock loops, the lock detect circuit monitors the stable filter voltage or checks to see that the reference signal REF and the feedback signal FB are matched in phase and/or frequency. However, in the case of a dithering PLL, the dithering action causes a constantly changing filter voltage and a constantly changing frequency/phase relationship.

Conventional approaches for dithering phase lock loops apply the filter voltage and/or the reference signal or feedback signal matching method by creating large tolerances that can absorb the modulation created by the dithering. However, such conventional approaches do not check whether the system is actually dithering as expected.

It would be desirable to have a lock detect for a dithering phase lock loop that operates reliably and checks to ensure that the system is actually dithering as expected.

SUMMARY OF THE INVENTION

The present invention concerns a first circuit and a second circuit. The first circuit may be configured to generate a first intermediate signal, a second intermediate signal, and a third intermediate signal in response to a first control signal, a second control signal, a third control signal, a reference signal and an output clock signal. The second circuit may be configured to generate an output signal in response to the first intermediate signal, the second intermediate signal, and the third intermediate signal. The output signal may indicate a lock condition between a feedback signal and the reference signal.

The objects, features and advantages of the present invention include implementing a digital lock detect for dithering phase lock loops that may (i) determine a lock condition by evaluating a number of points where an offset value has a maximum positive or negative value; and/or (ii) check and/or ensure that the system is actually dithering as expected.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
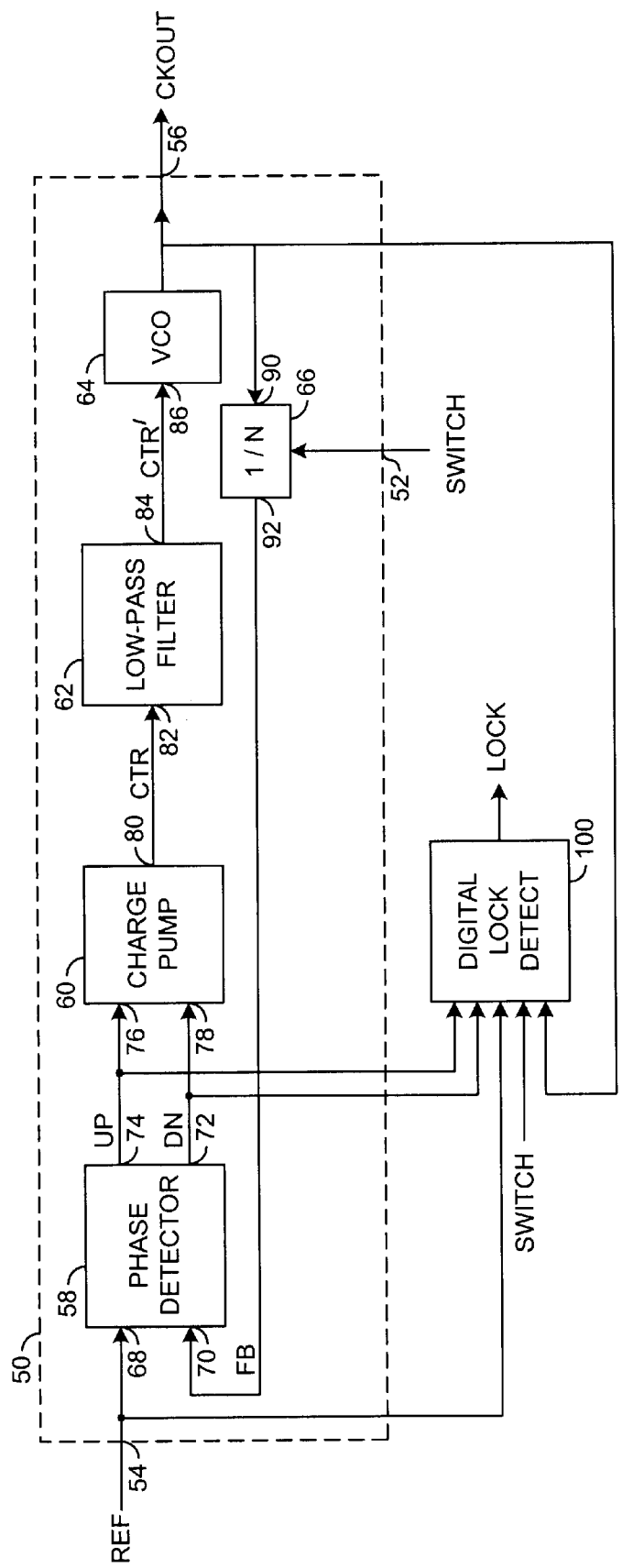
FIG. 1 is a block diagram illustrating a preferred embodiment of the present invention in the context of a dithering phase lock loop.

Referring to FIG. 1, a block diagram of a circuit 100 is shown illustrating a preferred embodiment of the present invention. The circuit 100 is shown implemented in the context of a dithering phase lock loop circuit 50. The circuit 100 may be implemented as a digital lock detect circuit.

The dithering phase lock loop 50 may have an input 52 that receives a control signal (e.g., SWITCH), an input 54 that receives a reference signal (e.g., REF) and an output 56 that presents a clock signal (e.g., CKOUT). The dithering phase lock loop 50 may be configured to generate the signal CKOUT in response to the signal REF, the signal SWITCH, and a feedback (e.g., a signal FB) of the signal CKOUT. The dithering phase lock loop 50 generally comprises a phase detector 58, a charge pump 60, a low pass filter 62, a voltage controlled oscillator 64, and a feedback divider 66.

The phase detector 58 generally has an input 68 that receives the signal REF and an input 70 that receives the signal FB. The phase detector 58 may also be implemented as a phase/frequency detector. The phase detector 58 generally has an output 72 that presents a pump-down signal (e.g., DN) and an output 74 that presents a pump-up signal (e.g., UP). The phase detector 58 may be configured to generate the signals DN and UP in response to the signals REF and FB. The signal DN may be presented to an input 78 of the charge pump 60 and the signal UP may be presented to an input 76 of the charge pump 60. The charge pump 60 may have an output 80 that presents a control signal (e.g., CTR) to an input 82 of the low pass filter 62. The low pass filter 62 may have an output 84 that presents a control signal (e.g., CTR') to an input 86 of the voltage controlled oscillator 64. The voltage controlled oscillator 64 may be configured to generate the signal CKOUT in response to the signal CTR'.

The signal CKOUT may be presented to an input 90 of the feedback divider 66. The feedback divider 66 generally has a second input that receives the signal SWITCH. The signal SWITCH may control a feedback divide value of the PLL 50. For example, the divider 66 may (i) employ a large divide value in response to a first state of the signal SWITCH (e.g., a logic high) and (ii) employ a small divide value in response to a second state (e.g., a logic low). The feedback divider 66 may have an output 92 that presents the feedback signal FB. FIG. 1 illustrates the connectivity between the circuit 100 and the dithering phase lock loop 50. The circuit 100 may be configured to generate an output signal (e.g., LOCK) in response to the signal REF, the signal UP, the signal DN, the signal SWITCH, and/or the signal CKOUT.

Figure 2:
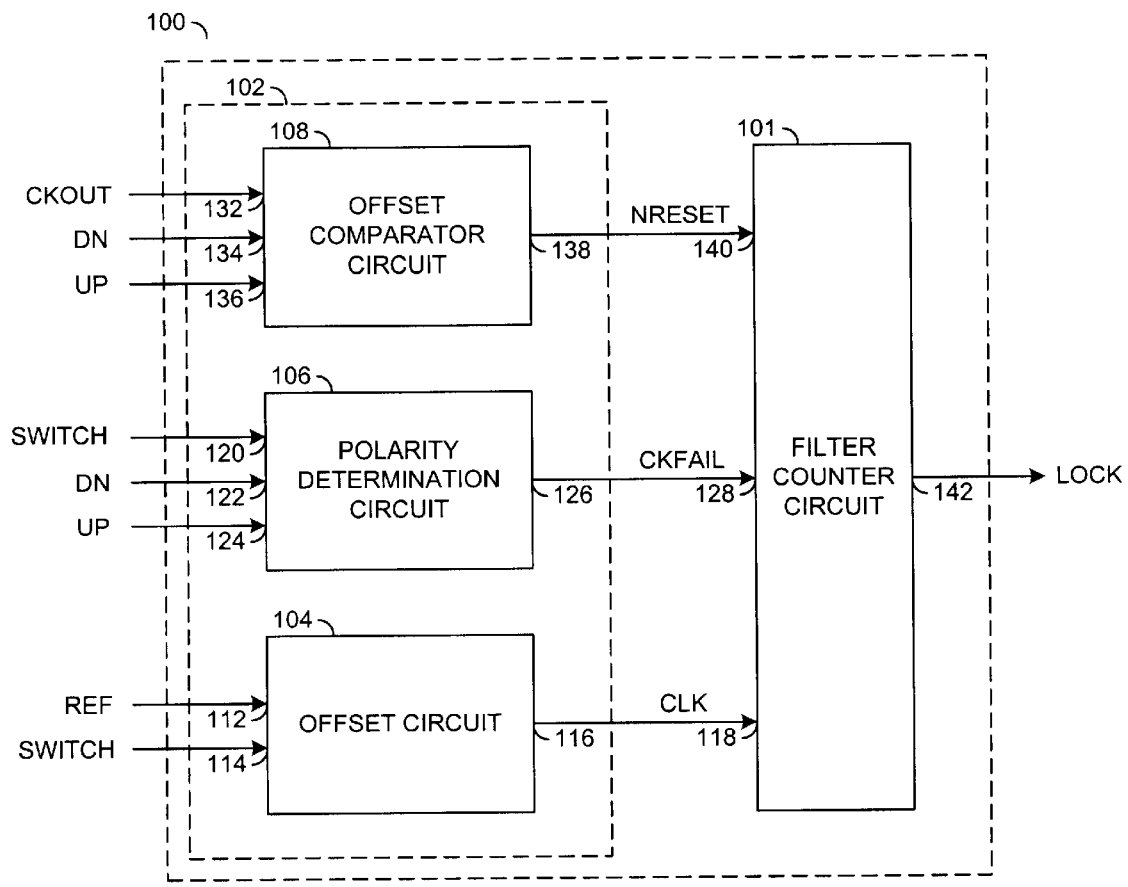
FIG. 2 is a detailed block diagram illustrating a preferred embodiment of the present invention.

Referring to FIG. 2, a detailed block diagram of the circuit 100 is shown. The circuit 100 generally comprises a circuit 101 and a circuit 102. The circuit 102 generally comprises a circuit 104, a circuit 106, and a circuit 108. The circuit 104 may be implemented as an offset circuit configured to determine where a maximum offset (e.g., the difference between the signal REF and the signal FB) occurs. The circuit 106 may be implemented as a polarity determination circuit configured to determine the polarity (e.g., whether the offset is a positive or negative value) of the offset to compare with an expected result. The circuit 108 may be implemented as an offset comparator circuit configured to determine whether the offset is greater than a predetermined value (e.g., whether the absolute value of the offset exceeds a specified maximum value). The circuit 108 may set an offset time as a number of output clock periods (e.g., the signal CKOUT) that may reduce and/or eliminate delay time changes of obtaining a locked condition due to process, voltage, and temperature changes. The offset time may be defined as the absolute difference in time between the rising edge of the signal REF and the rising edge of the signal FB. The circuit 101 may be implemented as a filter counter circuit. The circuit 101 may be configured to count the number of consecutive passing cycles (e.g., of the clock signal CKOUT) and generate the signal LOCK when the number reaches a predetermined value.

The circuit 100 may be configured to receive a number of signals including the pump-up signal UP and the pump down signal DN. The signal CKOUT may be the output from the dithering phase lock loop 50. The signal REF may be a reference signal (or frequency). The signal FB may be the output signal of the feedback divider 66. The circuit 100 may generate the signal LOCK in response to a lock condition of the circuit 50.

The circuit 104 generally has an input 112 that may receive the reference signal REF and an input 114 that may receive the signal SWITCH. The circuit 104 may have an output 116 that may generate a signal (e.g., CLK). The signal CLK may be presented to an input 118 of the circuit 102.

The circuit 106 generally has an input 120 that may receive the signal SWITCH, an input 122 that may receive the signal UP, and an input 124 that may receive the signal DN. The circuit 104 generally has an output 126 that may present a signal (e.g., CLKFAIL) that may be presented to an input 128 of the circuit 108. The signal CLKFAIL may attain a high value when the polarity, as determined by the polarity determination circuit 106, is a predetermined value.

The circuit 108 generally has an input 132 that may receive the signal CKOUT, an input 134 that may receive the signal DN, and an input 136 that may receive the signal UP. The circuit 108 may have an output 138 that may present a signal (e.g., NRESET). The signal NRESET may be presented to an input 140 of the circuit 102. The circuit 101 may have an output 142 that may present the signal LOCK. The circuit 101 may be configured to generate the signal LOCK in response to the signal NRESET, the signal CLKFAIL, and/or the signal CLK.

Figure 3:
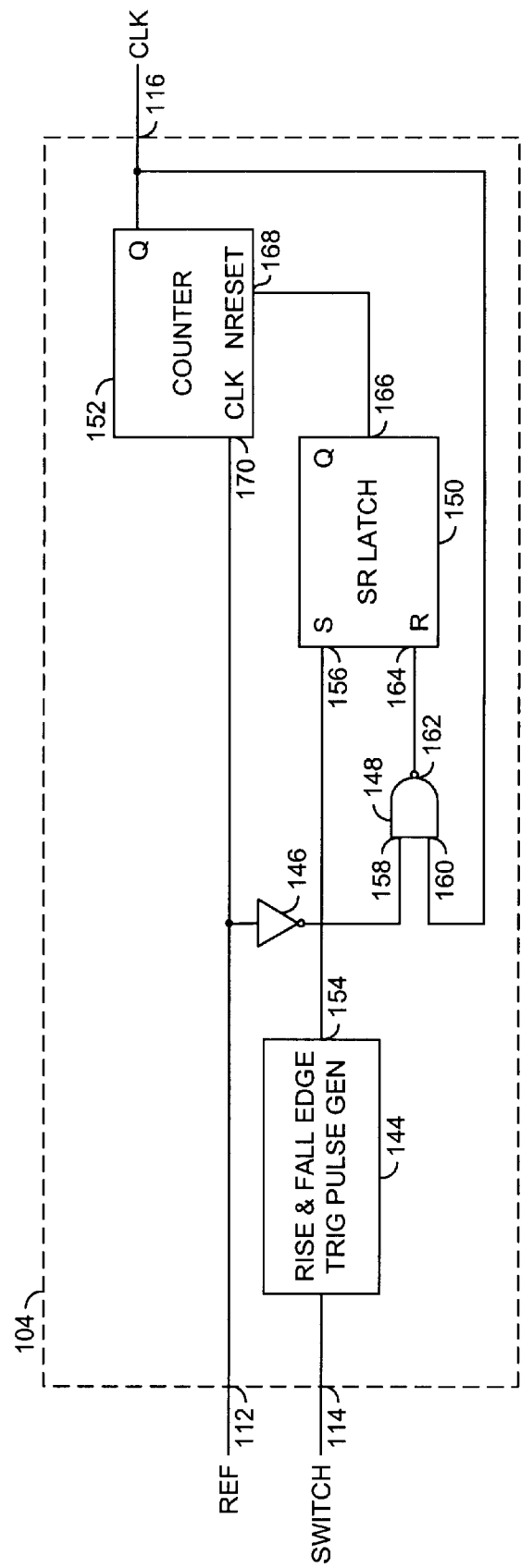
FIG. 3 is a more detailed block diagram of an offset circuit of FIG. 2.

Referring to FIG. 3, a more detailed block diagram of the offset circuit 104 is shown. The circuit 104 generally comprises a circuit 144, a gate 146, a gate 148, a circuit 150, and a circuit 152. The circuit 150 may also be implemented as a latch. The circuit 152 may be implemented as a counter. The circuit 144 may be implemented as a rise and fall edge-triggered pulse generator. The gate 146 may be implemented as an inverter. The gate 148 may be implemented, in one example, as a NAND gate. The circuit 150 may be implemented as an RS-type latch (or flip-flop). The latch (or flip-flop) 152 may be implemented as a D-type latch (or flip-flop). While specific examples of an inverter, a NAND gate, an RS-type latch and a D-type latch have been described, other appropriate logic may be implemented to meet the design criteria of a particular implementation.

The circuit 144 may have an output 154 that may present a signal to a set input 156 (e.g., S) of the circuit 150. The gate 148 may have a first input 158 that may receive a complement of the reference signal REF. The signal REF may be inverted by the gate 146. The gate 148 may have an input 160 that may receive the output signal CLK. The gate 148 may have an inverted output 162 that may provide a signal to the reset input 164 (e.g., R) of the circuit 150. The circuit 150 may have an output 166 (e.g., Q) that may generate a reset signal provided to an input 168 of the circuit 152. The circuit 152 may have a clock input 170 that may receive the reference signal REF. The circuit 152 may generate the clock signal CLK. The circuit 152 may be configured as a rising-edge triggered counter. The circuit 104 may be implemented to determine when a maximum offset occurs.

Figure 4:
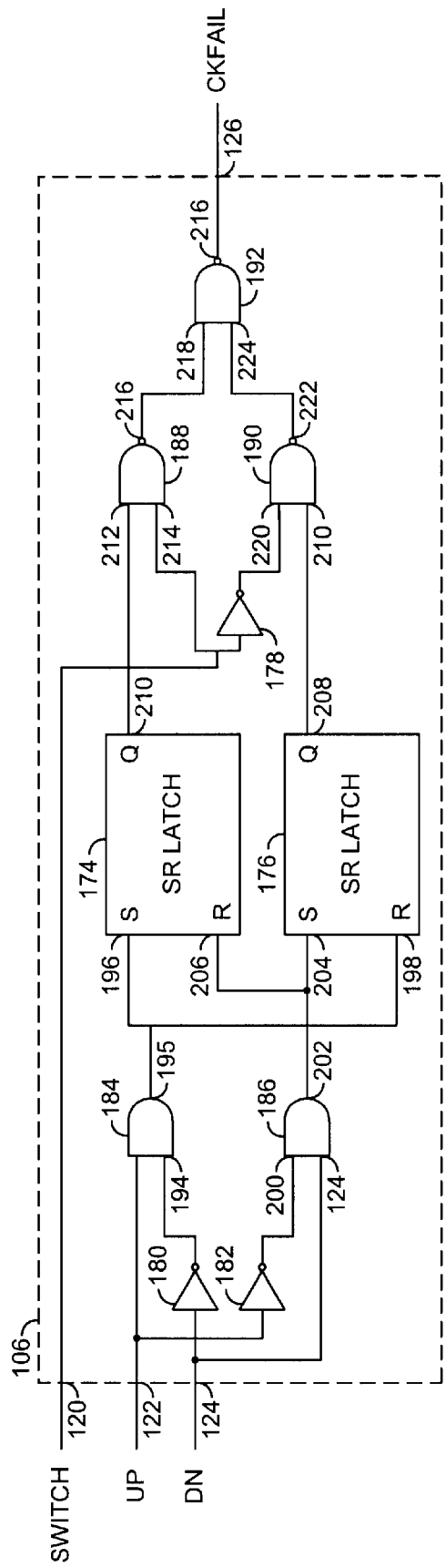
FIG. 4 is a more detailed block diagram of a polarity determination circuit of FIG. 2.

Referring to FIG. 4, a more detailed block diagram of the polarity determination circuit 106 of FIG. 2 is shown. The circuit 106 generally comprises a circuit 174, a circuit 176, a gate 178, a gate 180, a gate 182, a gate 184, a gate 186, a gate 188, a gate 190, and a gate 192. The circuit 174 and the circuit 176 may be implemented as RS-type flip-flops or latches. The gates 178, 180, and 182 may be implemented as inverters. The gates 184 and 186 may be implemented as AND gates. The gates 188, 190, and 192 may be implemented as NAND gates. While RS-type flip-flops, inverters, AND gates, and NAND gates have been described, other logic and/or combinations of logic may be implemented to meet the design criteria of a particular implementation.

The gate 184 may have a first input that may receive the signal UP. The signal DN may be presented to an input of the gate 180. An output of the gate 180 may be coupled to an input 194 of the gate 184. The gate 184 may have an output 195 that may provide a set signal to an input 196 (e.g., S) of the flip-flop 174 and a reset signal to an input 198 (e.g., R) of the flip-flop 176. The gate 186 may have an input that may receive the signal DN. The signal UP may be presented to an input of the gate 182. An output of the gate 182 may present a complement of the signal UP to an input 200 of the gate 186. The gate 186 may have an output 202 that may provide a set signal to an input 204 (e.g., S) of the flip-flop 176 and a reset signal to an input 206 (e.g., R) of the flip-flop 174. The flip-flop 176 may have an output 208 (e.g., Q) that may be coupled to an input 210 of the gate 190. The flip-flop 174 may have an output 210 (e.g., Q) that may be coupled to an input 212 of the gate 188. The gate 188 may have an input 214 that may receive the control signal SWITCH. The gate 188 may have an output 216 that may be coupled to an input 218 of the gate 192. The signal SWITCH may be presented to an input of the gate 178. The gate 190 may have an input 220 that may receive a complement of the control signal SWITCH from an output of the gate 178. The logic gate 190 may have an output 222 that may be coupled to an input 224 of the gate 192. The gate 192 may have an output that may present the signal CLKFAIL. The circuit 106 may be implemented to determine the polarity of the offset to compare with an expected polarity.

Figure 5:
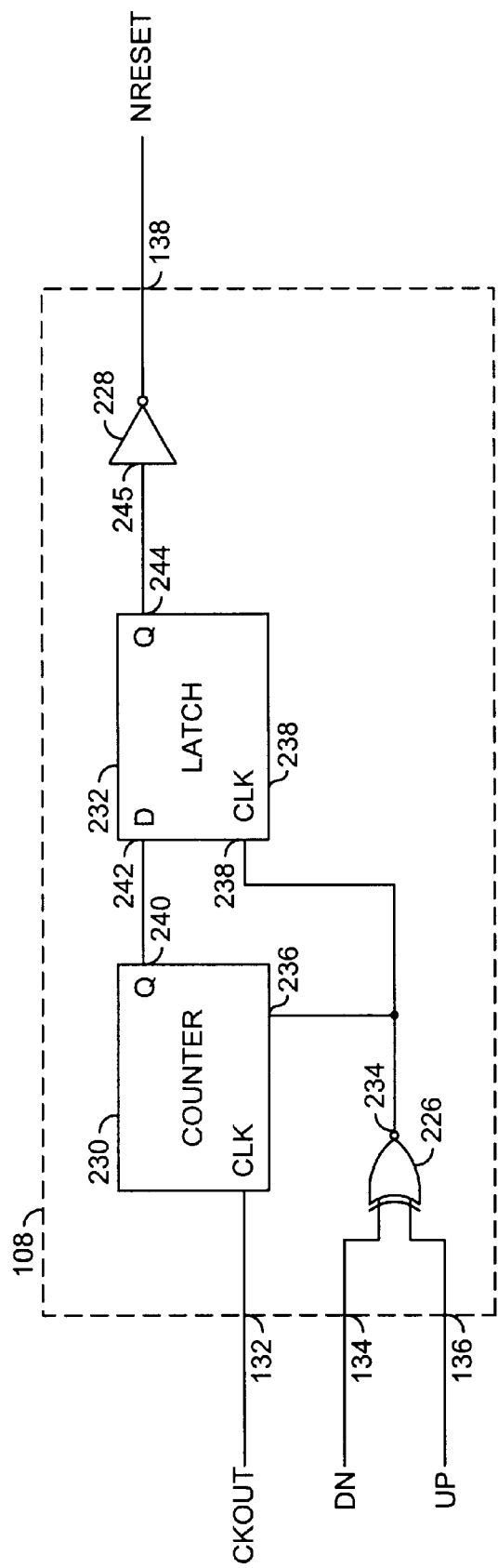
FIG. 5 is a more detailed block diagram of an offset comparator circuit of FIG. 2.

Referring to FIG. 5, a more detailed block diagram of the offset comparator circuit 108 of FIG. 2 is shown. The circuit 108 generally comprises a gate 226, a gate 228, a circuit 230, and a circuit 232. The gate 226 may be implemented as an XNOR gate. The gate 228 may be implemented as an inverter. The circuit 230 and the circuit 232 may be implemented as D-type latches or flip-flops. While an XNOR gate, an inverter, and D-type flip-flops have been described, other logic and/or combinations of logic may be implemented to meet the design criteria of a particular implementation.

The gate 226 may have a first input that may receive the signal UP and a second input that may receive the signal DN. The gate 226 may have an output 234 that may generate a reset signal presented to an input 236 of the circuit 230 and to an input 238 of the circuit 232. The circuit 230 may have an input that may receive the dithering PLL output signal CKOUT. The flip-flop 230 may have an output 240 (e.g., Q) that may be coupled to a data input 242 (e.g., D) of the circuit 232. An output 244 (e.g., Q) of the circuit 232 may present a signal to an input of the inverter 228. An output of the inverter 228 may present the signal NRESET at the output 138. The circuit 108 may be implemented to determine whether the offset is greater than a predetermined maximum value. The circuit 108 may set the offset time as a number of output clock periods that may reduce and/or eliminate delay time changes due to process, voltage, and temperature changes.

Figure 6:
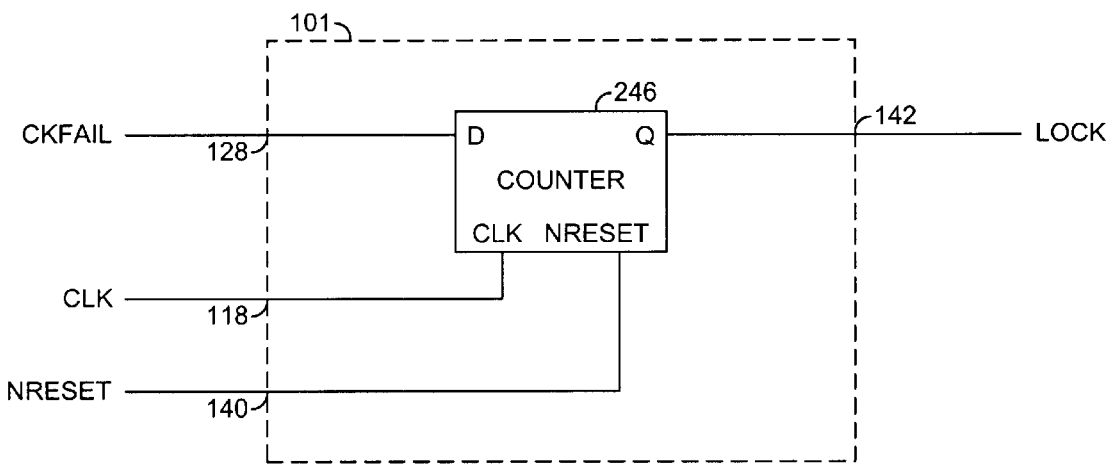
FIG. 6 is a more detailed block diagram of a filter counter circuit of FIG. 2.

Referring to FIG. 6, a more detailed block diagram of the filter counter circuit 102 of FIG. 2 is shown. The circuit 102 may be implemented as a counter 246. The counter 246 may receive the signal NRESET, the signal CLK, and the signal CLKFAIL. The counter 246 may generate the signal LOCK in response to the signal CLKFAIL, the signal CLK and the signal NRESET. The circuit 108 may be implemented to count the number of consecutive passing cycles during which the offset polarity matches the polarity predicted by the feedback direction. The circuit 102 may generate the signal LOCK when the number of cycles reaches a predetermined maximum value.

When the phase lock loop 50 obtains a lock, the offset between the reference signal REF and the feedback signal FB may oscillate between a positive value and an equal but opposite negative value. The first update after the feedback divider 66 changes may cause the output signal CKOUT to start changing toward the new value. An analysis may be performed on a loop parameter to determine how many reference pulses will occur after a feedback divide change (e.g., a change in state of the signal SWITCH) until the offset reaches a maximum positive or negative value. Furthermore, the offset polarity may be determined by evaluating the previous direction of the changes of the feedback divider 66.

The present invention may determine lock by evaluating the points where the offset should be at a maximum positive or negative value. At these points the polarity of the offset may be determined and compared to the expected polarity by the circuit 106 to determine the direction of the feedback divider change of the signal SWITCH. If the measured polarity of the offset matches the polarity predicted by the feedback direction, the cycle is considered a passing cycle. The counter 246 may then be used to count the number of consecutive passing cycles. Once the counter 246 detects a predetermined number of passing cycles, a lock indicator (e.g., the output signal LOCK) is generally asserted (e.g., set high). The counter 246 is generally implemented to compensate for the phase lock loop 50 passing several cycles before obtaining a lock. During this pre-lock time, the offset polarity may have the correct polarity for a few cycles without the phase lock loop 50 being in a locked state. The counter 246 may be used as a filter to ensure that the lock signal LOCK is not asserted during the pre-lock time.

A second check for lock may also be included. For example, after the polarity of the peak offset is determined, the magnitude may be compared to a predefined maximum value by the circuit 108. The comparison may ensure that the phase lock loop 50 is not under-damped and does not oscillate beyond the predicted maximum. When the offset is greater than the maximum, the cycle may be considered a failing cycle and the counter 246 may be reset even if the polarity determination circuit 106 is used.

Figure 7:
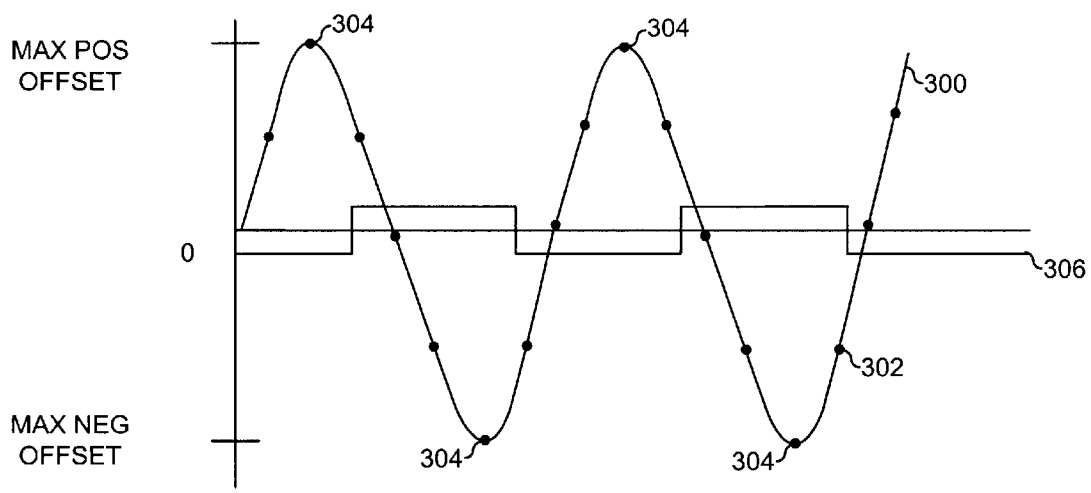
FIG. 7 is a timing diagram illustrating phase offset versus time during a lock condition of the present invention.

Referring to FIG. 7, a timing diagram illustrating phase offset versus time during lock is shown. The PLL 50 of FIG. 1 generally provides a sampled system which is sampled at the frequency of the signal REF. An offset curve 300 (e.g., based on the difference between feedback signal FB and the reference signal REF that illustrates how the offset may change with time for a continuous time system) is shown sampled at a number of update points 302. The dots 302 generally represent the offset between the signal REF and the signal FB at each sampled point. The maximum offset check may occur at positions illustrated by symbols 304. The square wave 306 generally represents when the system switches the value of the N divider 66 between a high count and a low count. The loop parameters and system implementation may be configured to determine the position of maximum and minimum sampled offsets 304. The points 304 generally provide the maximum signal and, therefore, the maximum noise margin to determine whether the offset is positive or negative.

Figure 8:
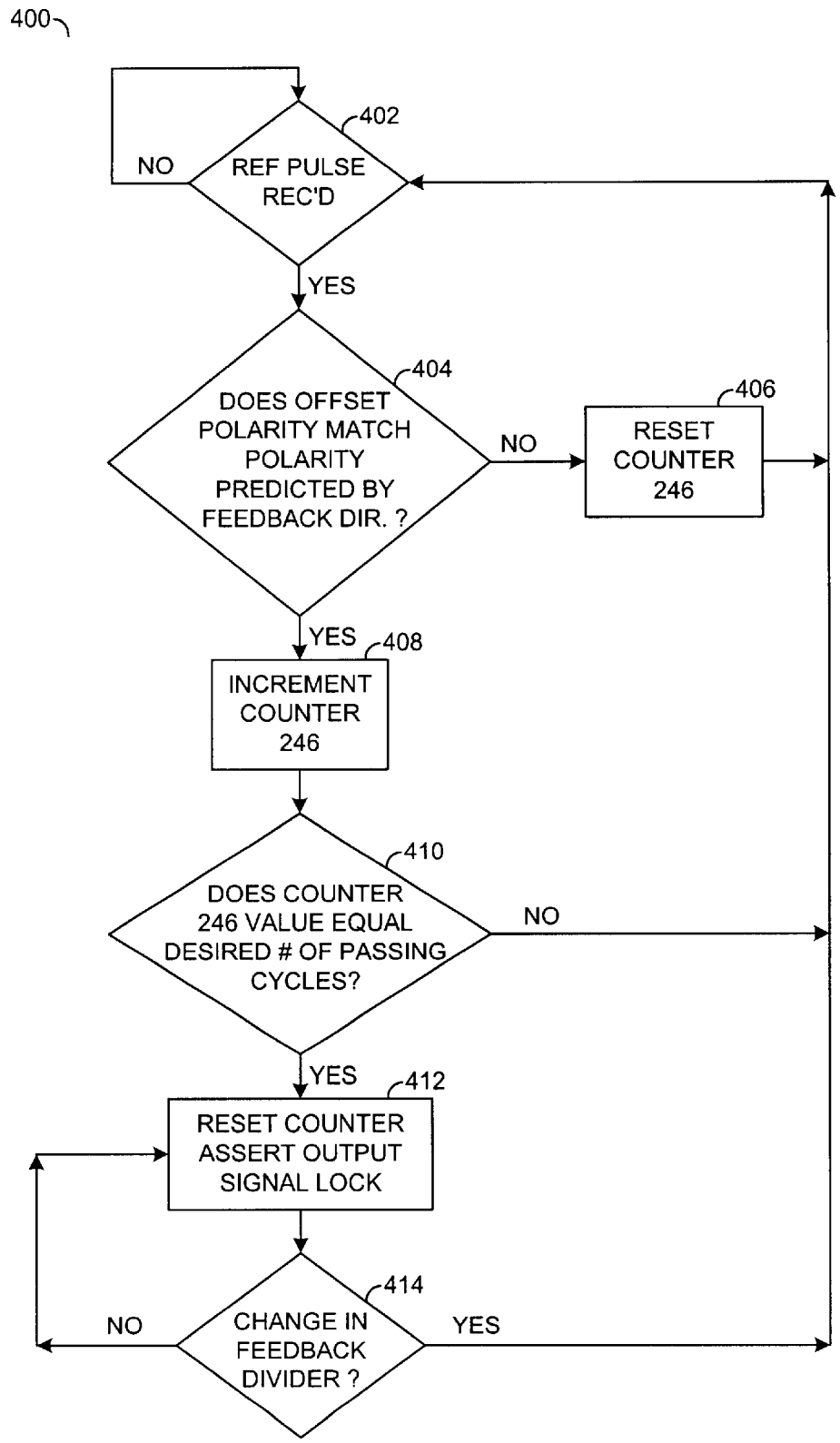
FIG. 8 is a flow diagram illustrating an example process in accordance with a preferred embodiment of the present invention.

Referring to FIG. 8, a flow chart 400 showing an example logic (or process) of the present invention is shown. The flow chart 400 generally comprises a decision state 402, a decision state 404, a state 406, a state 408, a decision state 410, a state 412 and a decision state 414. In the decision state 402, the input signal REF of the dithering PLL 50 may be monitored for a pulse. When a pulse is received, the process 400 may proceed to the decision state 404. In the decision state 404 the offset polarity (e.g., as determined by the offset circuit 104 and the polarity determination circuit 104) may be compared to the predicted value of the feedback direction (e.g., by the offset comparator circuit 108). When the polarities do not match, the state 406 may be executed to reset a count of the number of passing cycles (e.g., the counter 246) and the process 400 may return to the state 402. When the polarities match, the process 400 may proceed to the state 408 where the number of passing cycles may be incremented (e.g., the counter 246) by a value of positive one. The process 400 generally proceeds to the decision state 410. The decision state 410 may check to see whether the number of passing cycles equals a desired (or target) number of passing cycles. When the number of passing cycles does not equal the target number of passing cycles, the process 400 may return to the state 402. When the number of passing cycles equals the target number of passing cycles, the process 400 generally moves to the state 412. The state 412 may reset the number of passing cycles (e.g., resetting the counter 246) and assert the signal LOCK. The process 400 generally moves to the decision state 414. The decision state 414 may monitor the control signal SWITCH for a change in the value of feedback divider 66. As long as the feedback divider 66 does not change, process 400 may loop through the state 412. When the feedback divider 66 changes value, the process 400 may return to the state 402.

Figure 9:
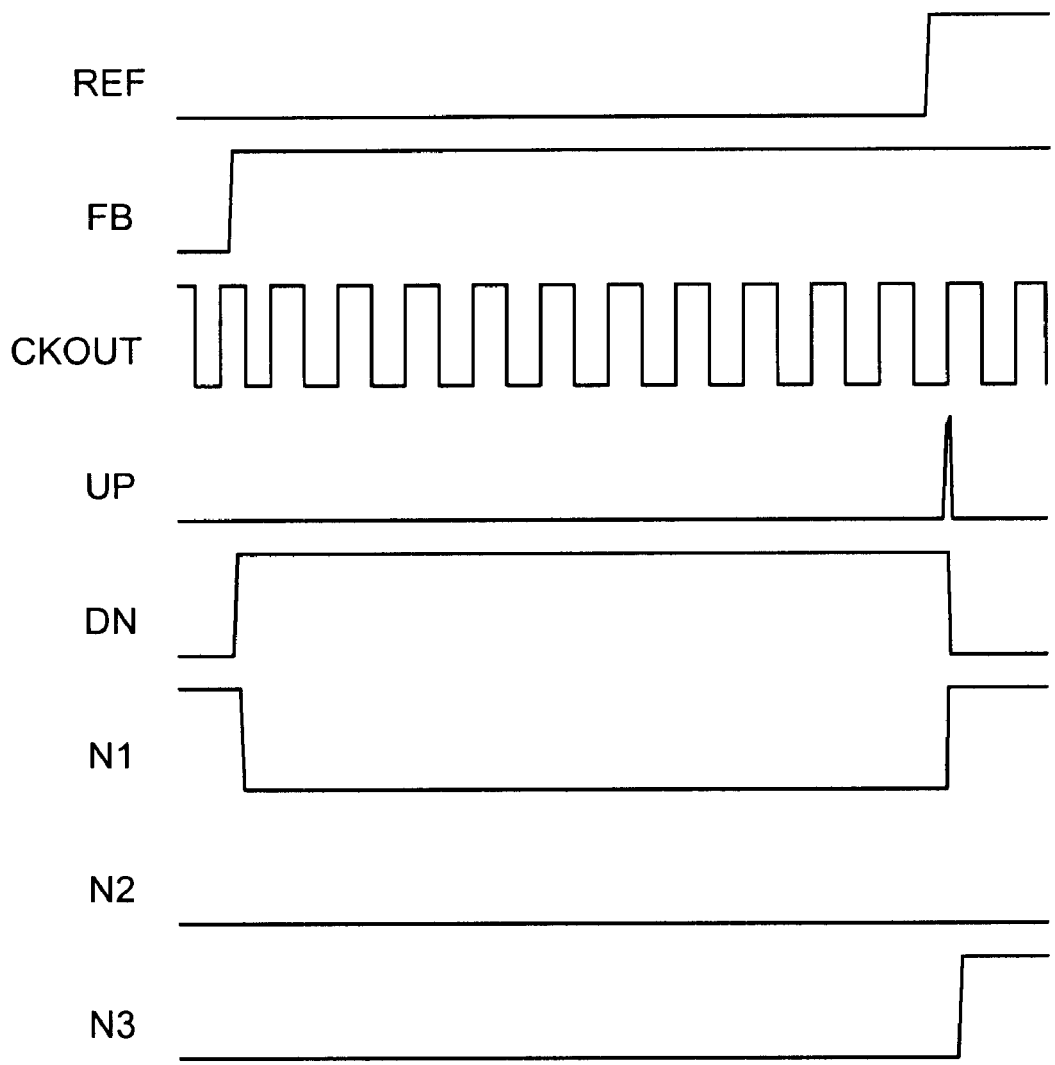
FIG. 9 is a timing diagram illustrating example signals of FIG. 5 while in a failing state.

Referring to FIG. 9, a timing diagram illustrating the various signals of FIG. 5 is shown when the signal LOCK indicates a failing state. Only a portion of a period of the signal REF is shown for clarity. The signal N1 may represent the output 234 of the gate 226. The signal N2 may represent the signal presented by the counter 240. The signal N3 may represent the signal NRESET presented by the circuit 108. The counter 230 starts counting rising edges of the signal CKOUT after the rising edge of the output 234. During the sixteenth rising edge of the signal CKOUT (e.g., when the counter 230 is set to 16), the signal N2 transitions high. When the signal N1 transitions high, the counter output signal N1 is loaded into the latch 232 and the signal NRESET remains low.

Figure 10:
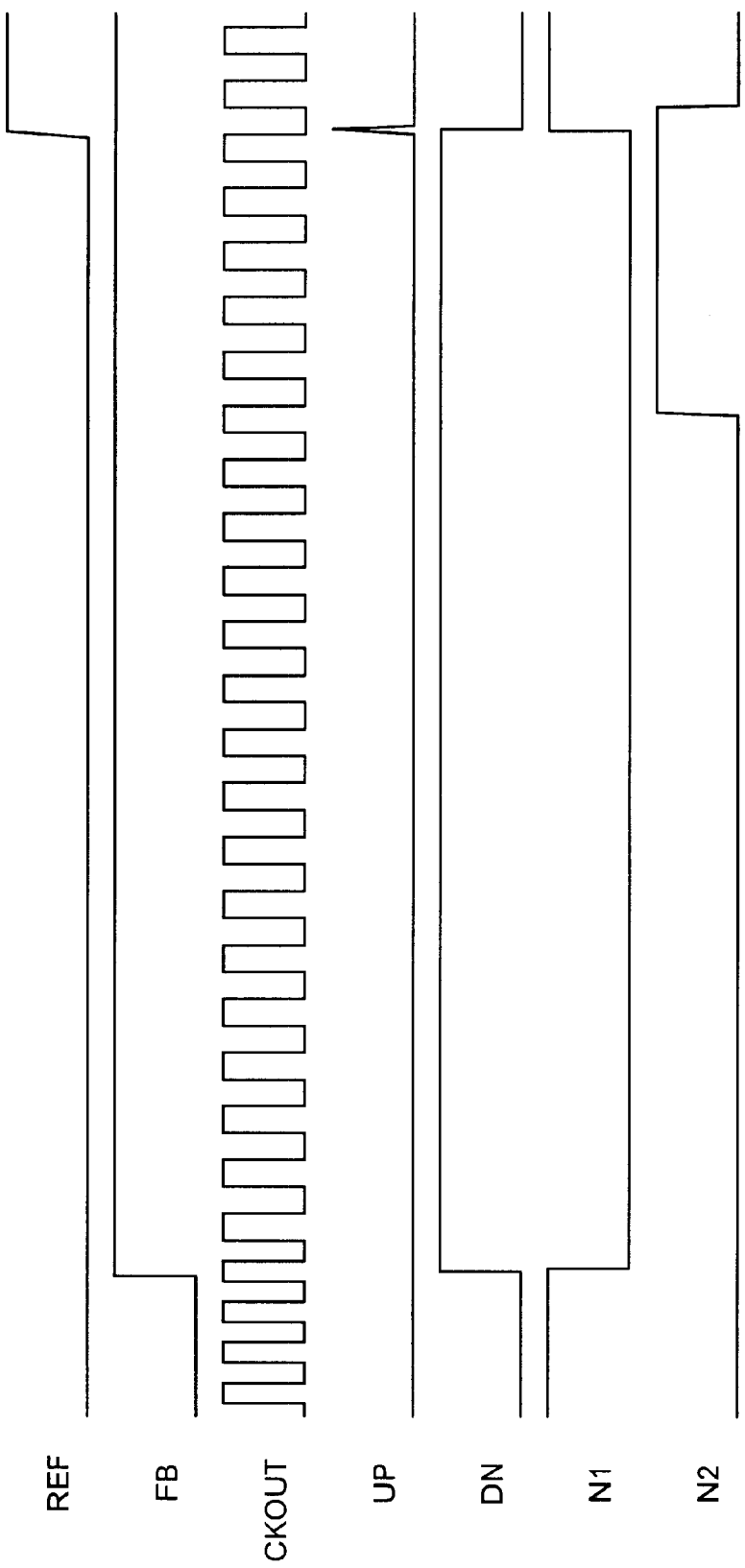
FIG. 10 is a timing diagram illustrating example signals of FIG. 5 while in a passing state.

Referring to FIG. 10, a timing diagram illustrating the various signals of FIG. 5 is shown when the signal LOCK indicates a passing state. Only a portion of a period of the signal REF is shown for clarity. The counter 230 starts counting rising edges of the signal CKOUT after the rising edge of the signal N1. The signal N1 transitions high before the 16th edge of the signal CKOUT (e.g., where the counter 230 is set to 16), loading the low value of the signal N2 into the latch 232. The signal NRESET transitions high. In one example, the signal FB may not need to be presented to the counter 230.

Figure 11:
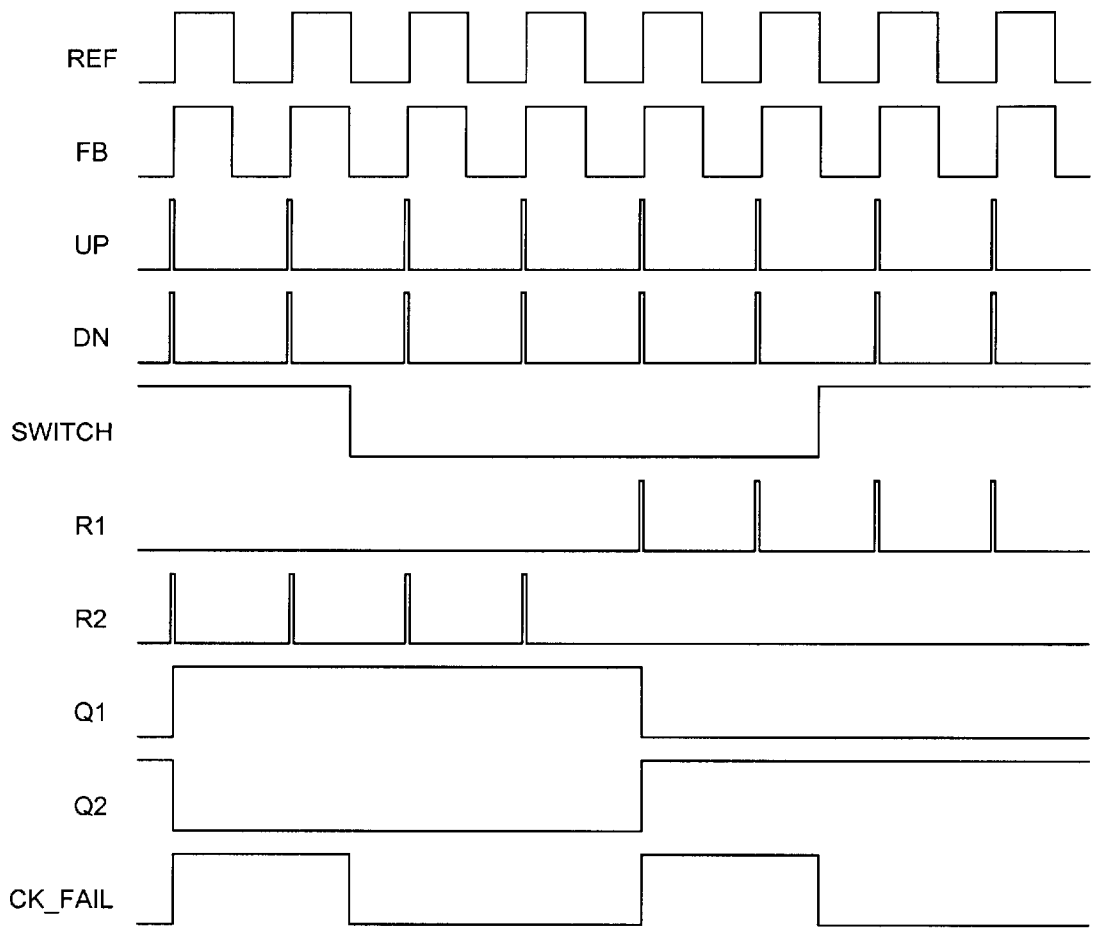
FIG. 11 is a timing diagram illustrating example signals of FIG. 4.

Referring to FIG. 11, a timing diagram of the various signals of FIG. 4 is shown. The signal REF and the signal FB are signals from FIG. 2. The signal R1 may represent the output 195. The signal R2 may represent the output 202. The signal Q1 may represent the latch output 210. The signal Q2 may represent the latch output 208. The signal CKFAIL may represent the output 126. The signal CKFAIL is clocked high when (i) the signal R1 or the signal R2 pulses high and (ii) either (a) the signal SWITCH is high and the signal R2 pulses high or (b) the signal SWITCH is low and the signal R1 pulses low. The signal CKFAIL is clocked low when (i) the signal R1 or the signal R2 pulses high and (ii) either (a) the signal SWITCH is high and the signal R1 pulses high or (b) the signal SWITCH is low and the signal R2 pulses low.

Figure 12:
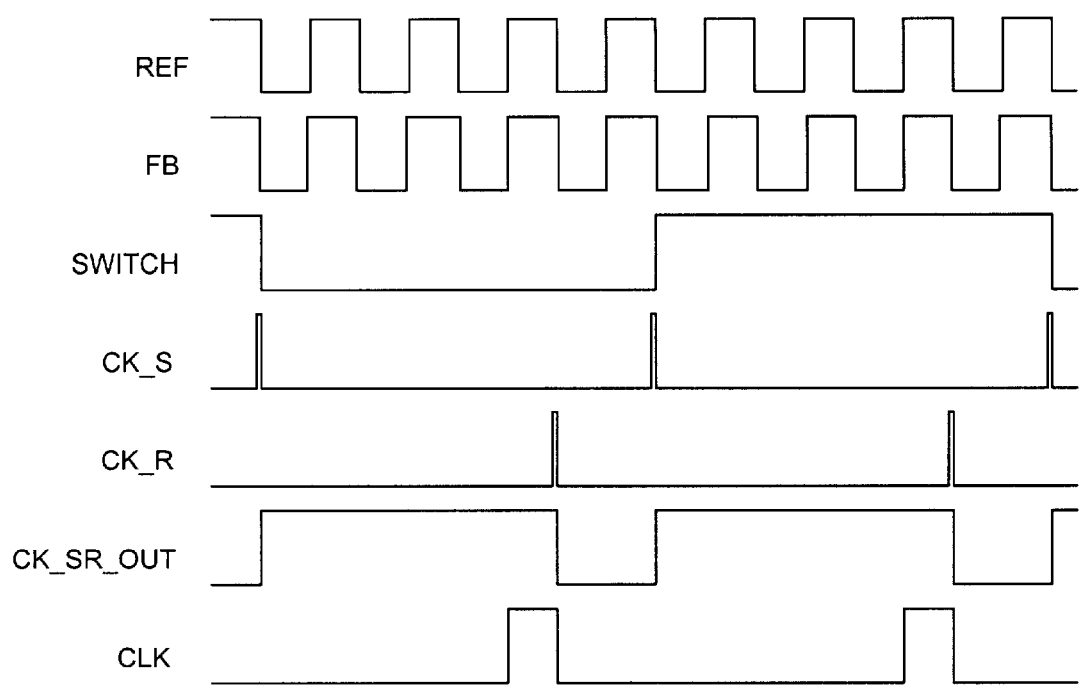
FIG. 12 is a timing diagram illustrating example signals of FIG. 3.

Referring to FIG. 12, a timing diagram of the various signals of FIG. 3 is shown. The signal CK_S may be an output of the pulse generator 144. The signal CK_R may be an output of the gate 162. The signal CK_SR_OUT may be an output of the SR latch 150. Each edge of the signal SWITCH produces a pulse on the set input 156 of the latch 152, which produces a high output and takes the counter 152 out of reset. The counter 152 then counts pulses of the signal REF until the predetermined number is reached (e.g., 3 counts are shown). After the predetermined number, a high transition occurs on the signal CLK. The falling edge of the signal REF is generally gated with the signal CLK to produce a pulse on the reset input of the latch 150. The latch 150 then produces a low output which places the counter 152 into reset, forcing the signal CLK low.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

The function performed by the flow diagram of FIG. 9 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions. In one example, the present invention may be implemented in a desktop printer.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate a first intermediate signal, a second intermediate signal, and a third intermediate signal in response to a first control signal comprising a feedback divide signal, a second control signal, a third control signal, a reference signal comprising a reference frequency and an output clock signal;
   a second circuit configured to generate an output signal comprising a lock signal in response to said first intermediate signal, said second intermediate signal, and said third intermediate signal, wherein said output signal indicates a lock condition between said output clock signal and said reference signal.

2. The apparatus according to claim 1, wherein said first circuit comprises:
   a third circuit configured to generate said first intermediate signal in response to said first control signal and said reference signal;
   a fourth circuit configured to generate said second intermediate signal in response to said first control signal, said second control signal and said third control signal; and
   a fifth circuit configured to generate said third intermediate signal in response to said output clock signal, said second control signal, and said third control signal.

3. The apparatus according to claim 1, wherein said first control signal, said second control signal, said third control signal and said reference signal are received from a dithering phase lock loop.

4. The apparatus according to claim 1, wherein said second control signal comprises a pump up signal generated by a phase detector.

5. The apparatus according to claim 1, wherein said third control signal comprises a pump down signal generated by a phase detector.

6. The apparatus according to claim 2, wherein said third circuit comprises an offset circuit configured to determine where a maximum offset will occur.

7. The apparatus according to claim 2, wherein said fourth circuit comprises a polarity determination circuit configured to determine a polarity of an offset compared with an expected result.

8. The apparatus according to claim 2, wherein said fifth circuit comprises a counter and a latch configured to determine when an offset is greater than a predetermined maximum.

9. The apparatus according to claim 8, wherein said fifth circuit is further configured to set an offset time as a number of output clock periods to reduce and/or eliminate delay due to process, voltage and temperature variations.

10. The apparatus according to claim 1, wherein said second circuit comprises a counter configured to count a number of consecutive passing cycles.

11. The apparatus according to claim 1, wherein said apparatus comprises a digital lock detect circuit in a dithering phase lock loop.

12. An apparatus comprising:
  means for generating a first intermediate signal, a second intermediate signal, and a third intermediate signal in response to a first control signal comprising a feedback divide signal, a second control signal, a third control signal, a reference signal comprising a reference frequency and an output clock signal;
  means for generating an output signal comprising a lock signal in response to said first intermediate signal, said second intermediate signal, and said third intermediate signal, wherein said output signal indicates a lock condition between said output clock signal and said reference signal.

13. A method of providing a digital lock detect for dithering phase lock loops comprising the steps of:
  (A) monitoring a reference signal of said dithering phase lock loop for a pulse;
  (B) comparing an offset polarity to a value as predicted by a feedback signal generated in response to said pulse;
  (C) resetting a counter in response to a non-matching condition after step (B);
  (D) incrementing said counter in response to said matching condition after step (B); and
  (E) asserting an output signal in response to said counter equaling a desired value.

14. The method according to claim 13, where said output signal is asserted in response to a number of passing feedback cycles.

15. The method according to claim 14, wherein said output signal comprises a lock detect for a dithering phase lock loop.

16. The method according to claim 14, wherein said method restarts in response to a change in a feedback divider value of said dithering phase lock loop.

17. The method according to claim 14, wherein said method is implemented to reduce and/or eliminate delay due to process, voltage, and temperature variations.

* * * * *